United States Patent [19]

Buchanan et al.

[11] Patent Number: 4,859,253
[45] Date of Patent: Aug. 22, 1989

[54] METHOD FOR PASSIVATING A COMPOUND SEMICONDUCTOR SURFACE AND DEVICE HAVING IMPROVED SEMICONDUCTOR-INSULATOR INTERFACE

[75] Inventors: Douglas A. Buchanan, Peekskill; Alessandro C. Callegari, Yorktown Heights, both of N.Y.; Peter D. Hob, Wädenswil, Switzerland; Dianne L. Lacey, Mahopac, N.Y.

[73] Assignee: International Business Machines Corporation, Armonk, N.Y.

[21] Appl. No.: 221,686

[22] Filed: Jul. 20, 1988

[51] Int. Cl.[4] .................. H01L 21/00; H01L 21/02; H01L 21/306; H01L 29/56
[52] U.S. Cl. .................. 148/33.3; 437/235; 437/244; 437/980
[58] Field of Search .............. 437/235, 242, 243, 244, 437/980; 156/643; 148/33.3

[56] References Cited

U.S. PATENT DOCUMENTS

| | | |
|---|---|---|
| 3,411,938 | 11/1968 | Storck et al. |
| 3,849,276 | 11/1974 | Greiner .................. 204/192 |
| 4,058,638 | 11/1977 | Morton .................. 427/39 |
| 4,297,176 | 10/1981 | Hannah et al. .............. 437/184 |
| 4,336,277 | 6/1982 | Brunshah et al. ............ 427/38 |
| 4,361,114 | 11/1982 | Gurev .................... 118/723 |
| 4,436,770 | 3/1984 | Nishizawa et al. ........... 427/38 |
| 4,514,437 | 4/1985 | Nath ...................... 427/39 |
| 4,526,802 | 7/1985 | Sato ...................... 427/39 |
| 4,597,825 | 7/1986 | Freeouf et al. ............. 156/643 |
| 4,645,683 | 2/1987 | Gourrier et al. ............ 437/241 |
| 4,706,377 | 11/1987 | Shuskus ................... 437/25 |

FOREIGN PATENT DOCUMENTS 196201 8/1986 Japan .
2158104 11/1985 United Kingdom .

OTHER PUBLICATIONS

Gourrier, S., Core Level Photoemission Study of the Interaction of Plasmas with Real Gallium Arsenide (100) Surfaces, Surf. Sci., 152-153(2), pp. 1147-1152.
Friedel, P., Interactions Between Molecular Hydrogen and Molecular Nitrogen Plasmas and a Gallium Arsenide (100) Surface: Chemical and Electronic Properties, Appl. Phys. Lett., 42(6), pp. 509-511.
Friedel et al., Photoemission Study of the Passive of GaAs in a Nitrogen Multipolar Plasma, Philosophical Magazine B, 1987, vol. 55, No. 6, pp. 711-719.
Chang et al., Plasma Oxidation of GaAs, Applied Physics Letters, vol. 29, No. 1, Jul. 1976, pp. 56-58.
Yokoyama et al., Low-Termperature Plasma Oxidation of GaAs, Appl. Phys. Lett. 32(1), Jan. 1978, pp. 58-60.
Friedel et al., Study of the Interaction of Plasmas with III-V Semiconductor Surfaces, Application to Passivation, Surface Science 168 (1986), pp. 635-644.
Sugano et al., Oxidation of GaAs P Surface by Oxygen Plasma and Properties of Oxide Film., J. Electrochem. Soc.: Solid-State Science and Technology, vol. 121, No. 1, Jan. 1974, pp. 113-118.
Boher et al., Structural and Electrical Properties of Silicon Nitride Films Prepared by Multipolar Plasma--enhanced Deposition, J. Appl. Phys. 63(5), Mar. 1988, pp. 1464-1472.
Weinreich, Oxide Films Grown on GaAs in Oxygen Plasma, Communications, pp. 2924-2926.
Koshiga et al., The Anodic Oxidation of GaAs in an Oxygen Plasma Generated by A D.C. Electrical Discharge, Thin Solid Films 56 (1979), pp. 39-49.
Chesler et al., dc Plasma Anodization of GaAs, Appl. Phys. Lett. 32(1) Jan. 1978, pp. 60-62.
Boher et al., $H_2$ Plasma Induced Effects on GaAs Examined by Photoluminescence, Ellipsometry and X-ray Photoemission, Proceedings of the Fourteenth International Symposium, Greece, Sep. 1987.

Primary Examiner—Brian E. Hearn
Assistant Examiner—B. Everhart
Attorney, Agent, or Firm—Scully, Scott, Murphy & Presser

[57] ABSTRACT

A method for passivating the surface of a compound semiconductor comprises annealing the substrate to form an anion rich surface layer containing cationic and anionic oxides and stripping the oxides to leave only a very thin anionic layer on the surface. The substrate is then subjected to an $H_2$ plasma cleaning to remove chemisorbed oxygen. An $N_2$ plasma cleaning is then performed to form an anionic nitride layer that is free of any cationic nitride. A layer of insulating material, such as, a native or other oxide, or a nitride, is deposited. The resulting structure has a very low interface state density such that the Fermi level may be swept through the entire band gap.

34 Claims, 2 Drawing Sheets

METHOD FOR PASSIVATING A COMPOUND SEMICONDUCTOR SURFACE AND DEVICE HAVING IMPROVED SEMICONDUCTOR-INSULATOR INTERFACE

BACKGROUND OF THE INVENTION

1. Field of the Invention

This invention relates to semiconductor structures having a compound semiconductor-insulator interface and a method for passivating compound semiconductor surfaces prior to deposition of an insulating material.

2. Description of the Prior Art

Recently, there has been extensive technological research in the area of growing insulating materials such as oxides and nitrides onto compound semiconductor substrates such as GaAs. The driving force behind this research is to realize MOS devices on III-V compound semiconductor substrates. Heretofor, attempts to fabricate MOS structures on GaAs have been unsuccessful due to the very high density of interface states which are nearly always present on exposed GaAs surfaces or at interfaces with virtually all materials. The presence of the high density of interface states causes the pinning of the GaAs interface Fermi level.

In the fabrication of MOS structures on III-V substrates, the surface Fermi level should be unpinned to allow the Fermi level to be varied by bias voltages applied to the gate electrode. The movement of the Fermi level permits the device to be operated in an inversion mode or an accumulation mode, depending on the polarity of the bias applied to the gate.

Previous attempts to deposit insulators onto compound semiconductor substrate surfaces have been largely unsuccessful due to the insulator-substrate interface defects. For example, the GaAs surface is composed of two oxides, $As_2O_3$ and $Ga_2O_3$. The $As_2O_3$ is of poor quality and can act metallic. The $Ga_2O_3$ is a high quality oxide that is stable up to 500° C. These surface oxides are approximately 20 to 30 angstroms thick. The GaAs surface presents problems because of the poor thermal stability of $As_2O_3$ and because free arsenic is present on the GaAs surface.

Prior attempts have been made passivate the compound semiconductor surface prior to deposition of an insulating material. U.S. Pat. No. 4,645,683 teaches treating a GaAs substrate in a hydrogen and arsine multipolar plasma to remove the oxides. The substrate is then treated in a nitrogen multipolar plasma to provide a protective layer of gallium nitride and arsenic nitride. Silicon nitride is then deposited onto the protective layer. Attempts to improve this process have included an initial chemical cleaning in a solution of hydrochloric acid to reduce the oxide thickness prior to the plasma treatments, as shown by Friedel, et al, "Photoemission Study of the Passivation of GaAs in a Nitrogen Multipolar Plasma." Philosophical Magazine, Vol. 55, pp. 711-719, 1987. Friedel, et al. recognize that a very high density of interface states still exists precluding MOSFET applications.

SUMMARY OF THE INVENTION

The present invention is directed to a method for passivating a compound semiconductor surface by forming an anionic nitride layer on the surface of the compound semiconductor substrate that is free of any detectable amounts of cationic nitride. In accordance with the invention, the anionic nitride layer is formed by annealing the substrate to form an anion rich surface layer that contains cationic and anionic oxides. The cationic and anionic oxides are then stripped from the surface leaving an anionic layer on the surface of the compound semiconductor. The oxides are typically stripped by a wet etch process using dilute hydrochloric acid. After the etch, the substrate is transferred in air to a plasma reactor. During the transfer, oxygen is chemisorbed by the substrate, most likely in the arsenic layer. In the reactor, the substrate is subjected to a plasma cleaning in hydrogen which is preferably a low pressure, low voltage treatment. The hydrogen cleaning removes any chemisorbed species from the anionic layer. The substrate is then subjected to a plasma cleaning in nitrogen also preferably at a low pressure and lo voltage. The $N_2$ nitriding of the anionic layer forms an anionic nitride layer on the surface of the substrate. This anionic layer is free from detectable amounts of cationic nitride. The nitridization step passivates the elemental arsenic thereby reducing the surface charge. In addition, no oxides are present on the surface.

Thereafter, an insulating material is deposited onto the passivated compound semiconductor surface. The insulating material is preferably deposited in situ, by electron beam evaporation in a low voltage, low pressure plasma, by sputtering or by PECVD techniques. The passivation of the compound semiconductor surface reduces the density of interface states to a very low level to permit the Fermi level to be swept through the entire band gap. The resulting insulating films are uniform and transparent. Thus, the fabrication of MOSFET devices on GaAs substrates may now be realized.

DETAILED DESCRIPTION OF THE INVENTION

Figure 1:
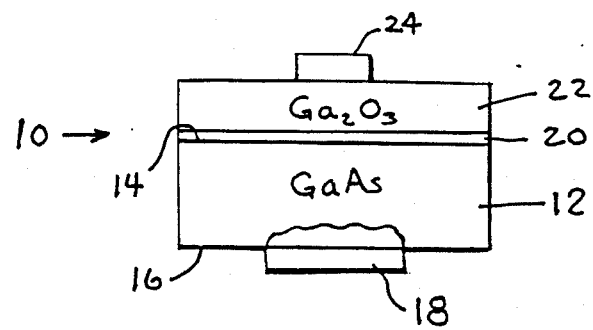
FIG. 1 is a cross sectional view of a semiconductor structure of the present invention.

In accordance with the method of the invention, the surface of the compound semiconductor substrate is passivated by forming a very thin layer of anionic nitride that is free of detectable amounts of cationic nitride on the surface of the compound semiconductor. A layer of insulating material is deposited on the anionic nitride layer. The interface between the insulating material and the substrate has a very low density of states so that the Fermi level may be swept through the entire band gap. The invention will be described in more detail hereinafter with respect to a substrate of gallium arsenide. However, it should be understood that the inventive method is applicable to any compound semiconductor material including any other III-V compounds and any II-VI compounds.

A substrate of bulk gallium arsenide is passivated in accordance with the invention by first annealing the substrate in a temperature range of 300-500° C. The substrate is preferably annealed in a nitrogen or argon atmosphere. The gallium arsenide substrate surface prior to annealing is composed of arsenic oxide and gallium oxide. After the annealing, the surface layer becomes arsenic rich and contains gallium oxide and small amounts of arsenic oxide. The majority of the arsenic oxide will be transformed into elemental arsenic in accordance with the following formula:

$$As_2O_3 + 2GaAs \rightarrow Ga_2O_3 + 4As$$

The gallium oxide formed from the above reaction combines with the gallium oxide already present on the surface to form a layer containing a large amount of gallium oxide with arsenic and small amounts of arsenic oxide. The resulting structure is then subjected to a wet etch in dilute HCl which strips the gallium oxide and the arsenic oxide leaving an extremely thin layer of arsenic. The layer of arsenic is on the order of one monolayer.

After the etch, the substrate is transferred in air which causes oxygen to be chemisorbed by the substrate. It is likely that the oxygen is chemisorbed in the arsenic layer. Although oxygen is chemisorbed, there are no arsenic or gallium oxides present on the substrate. The substrate is then introduced into a plasma reactor where it is subjected to a plasma cleaning in hydrogen at a temperature in the range of 150° to 300° C. The $H_2$ plasma cleaning is preferably performed at low pressure and low voltage. Typically, the $H_2$ plasma is performed in a range of 1 to 10 mTorr and at a voltage in the range of $-50$ to $-250$ volts dc. The $H_2$ plasma reduces the GaAs surface by stripping any chemisorbed oxygen from the surface. Preferably, the $H_2$ plasma is an RF plasma process. The surface layer is free from gallium and arsenic oxides, however, the elemental arsenic is not depleted Thus, the monolayer of arsenic on the surface of the gallium arsenic substrate remains.

The substrate is then subjected to a RF plasma cleaning in $N_2$, also preferably at low pressure and low voltage. The range of the $N_2$ plasma conditions are identical to the range of conditions set forth above for the $H_2$ plasma. In addition, it is preferred that the $N_2$ and $H_2$ plasmas be performed in situ. The surface of the substrate after the $H_2$ plasma containing the monolayer of elemental arsenic is highly reactive. The RF nitridization will passivate the GaAs surface by forming a layer of arsenic nitride. Since nitrogen has the same valence as arsenic, As-N bonds will form. Thus, the elemental arsenic is passivated which has the result of reducing the surface charge of the structure. Typically, the charge will be reduced from $10^{13}$ eV/cm$^2$ to $10^{11}$ eV/cm$^2$. The AsN layer is free from any detectable amounts of gallium nitride. Thus, the passivated gallium arsenide substrate is provided with a surface that is suitable for deposition of an insulating material. The gallium arsenide surface is passivated by the AsN layer to the extent that the density of states present at the semiconductor/insulator interface is low enough to permit the Fermi level to be swept through the entire band gap.

As shown in FIG. 1, the structure 10 includes a gallium arsenide substrate 12 having a first major surface 14 and a second major surface 16. A metallic contact, such as, AuGeNi, may be formed on the surface 16 during the initial annealing step. The substrate 12, after having the surface 14 passivated in accordance with the method of the present invention, includes a very thin layer of arsenic nitride 20. An insulation layer 22 is deposited onto the arsenic nitride layer 20, which in the illustrative embodiment in FIG. 1 is gallium oxide. A gate contact 24 is deposited onto the oxide layer 22 to complete the structure.

Figure 2:
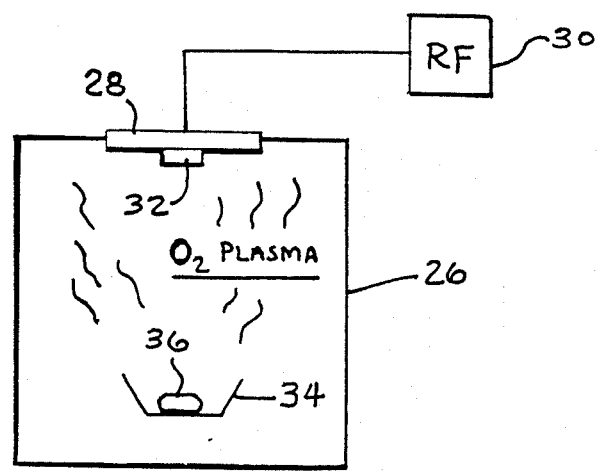
FIG. 2 is a schematic of the scheme for the hydrogen and nitrogen plasma cleaning and for depositing an insulating layer onto the compound semiconductor surface.

The gallium oxide layer 22 is preferably deposited by electron beam evaporation in a low voltage, low pressure $O_2$ plasma. As shown in FIG. 2, the scheme for E-beam evaporation includes a chamber 26 having a cathode 28 coupled to an RF source 30. A passivated gallium arsenide substrate 32 is positioned in contact with the cathode 28. A crucible 34 containing pure gallium 36 is placed in the chamber and an $O_2$ plasma is created by introducing oxygen through line 38, which causes $Ga_2O_3$ to be reactively deposited onto the passivated gallium arsenide substrate. In a preferred embodiment, the substrate is passivated in situ in chamber 26 by first creating a hydrogen plasma by opening line 40 and then creating a nitrogen plasma by closing line 40 and opening line 42. The pressure and voltage ranges for the deposition of the oxide are preferably 1 to 10 mTorr and $-50$ to $-250$ volts dc, respectively. Temperature conditions are in the range of 24 to 260° C. The gallium oxide layer is uniform and transparent and can be grown to a thickness of 1000 angstroms or more. Sample oxides have been deposited at thicknesses ranging from 950 to 1100 angstroms across a 51 mm wafer. Ellipsometry analysis shows that the oxides have an index of refraction in the range between 1.50 to 1.90.

In accordance with the practice of the invention, a substrate of bulk gallium arsenide was annealed at 450° C. An substrate of bulk AuGeNi metallic contact was alloyed during this step on one surface of the substrate. On the opposite surface of the substrate, an x-ray photospectroscopy analysis (XPS) revealed that the surface contained substantial amounts of gallium oxide together with small amounts of arsenic oxide and elemental arsenic. The substrate was then dipped in a dilute HCl solution to etch the gallium and arsenic oxides from the surface. XPS tests indicated that no oxides were present with only a very thin layer of arsenic remaining. After the etch, the substrate was transferred in air which caused oxygen to be chemisorbed on the substrate. XPS analysis showed no arsenic or gallium oxide present. The substrate was then introduced into a plasma reactor where it was subjected to the plasma cleaning in hydrogen with the substrate held at a temperature of 200° C. The hydrogen was at a pressure of 5 mTorr and the voltage applied was $-150$ volts dc. The $H_2$ plasma cleaning was performed for one minute. XPS analysis of the substrate after the $H_2$ cleaning indicated no oxygen present.

The substrate was then subjected to a plasma nitridization in $N_2$ with the substrate being held at a temperature of 200° C. The pressure was again 5 mTorr and the voltage $-150$ volts dc. The $N_2$ plasma cleaning was also performed for one minute. The XPS results showed a shoulder indicating arsenic nitride. The results indicated that the arsenic nitride layer was free from detectable amounts of gallium nitride.

Thereafter, a layer of $Ga_2O_3$ was deposited by electron beam evaporation of pure gallium through a low voltage, low pressure $O_2$ plasma. The plasma pressure was 2 mTorr at $-100$ volts dc. The temperature was 24° C. Ellipsometry analysis indicated that the oxide had an index of refraction of 1.58. The thickness of the oxide layer was approximately 75 nanometers. Auger analysis indicated only the presence of gallium and oxygen with no arsenic.

Figure 3:
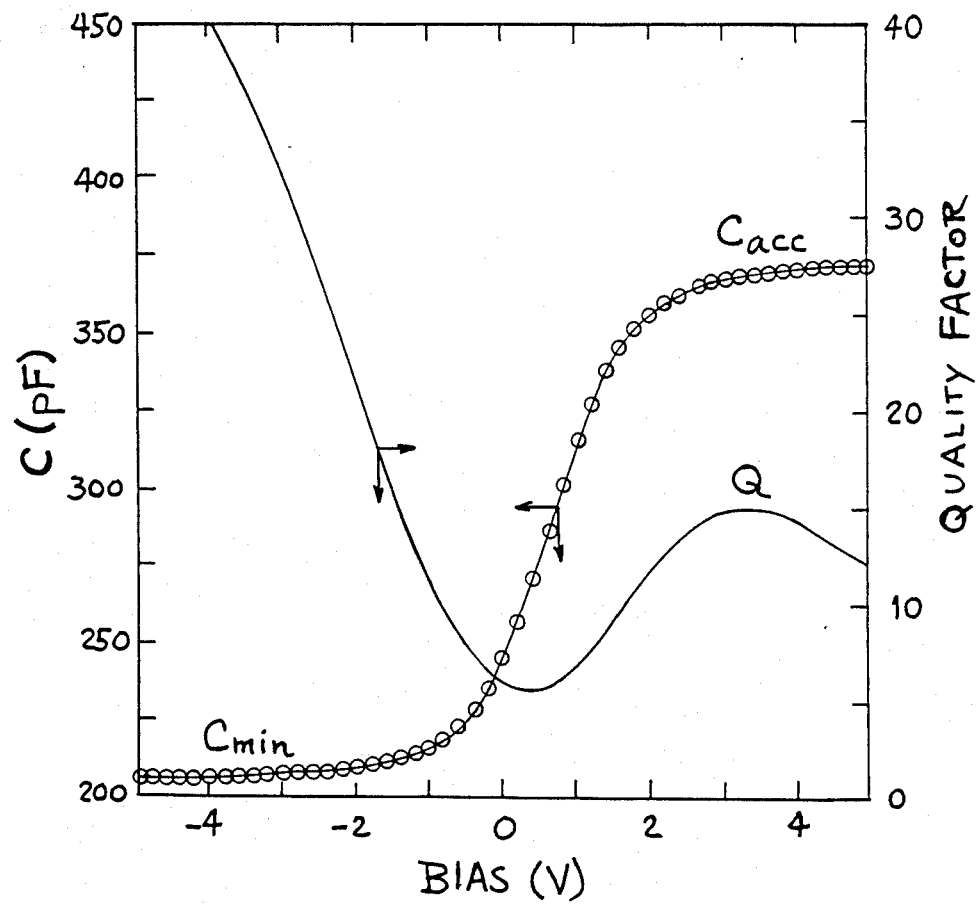
FIG. 3 is a graph showing the capacitance vs. voltage characteristics of a structure of the present invention.

The gallium oxide deposition should preferably take place in situ to prevent interface contamination due to air exposure. After the deposition of the oxide, a thin AsN layer remains at the interface. A gold contact was deposited onto the gallium oxide surface to form an MOS diode and a bias voltage was applied to the structure. FIG. 3 shows the MOS capacitance vs. voltage plot for a frequency of 1 MHz. The transition from depletion to accumulation is sharp. From accumulation, the dielectric constant $\epsilon_i$ of $Ga_2O_3$ can be derived using $C_{acc} = \epsilon_i \epsilon A / t_{ox}$, where A is the diode area and $t_{ox}$ is the oxide thickness. For $t_{ox} = 75$ nm and $A = 3.84 \times 10^{-3}$ cm$^{-2}$, $\epsilon_i$ is found to be 8.3. The minimum capacitance Cmin is evaluated according to:

$$C_{min} \simeq \frac{\epsilon_i}{t_{ox} + (\epsilon_i/\epsilon_s)\omega_m}$$

$$\omega_m = \sqrt{\frac{4\epsilon_s KT l_n (N_d/n_i)}{q^2 N_d}}$$

Where, $\epsilon_s$ is equal to 12.9, $N_d$ is the dopant and is equal to $2 \times 10^{17}$ cm$^{-3}$ and n is the intrinsic carrier concentration and is equal to $1.79 \times 10^6$ cm$^{-3}$, $C_{min}$ is found to be 205 pF. which is very close to the capacitance measured from FIG. 3. Thus, devices for integrated circuits may be fabricated having a gallium oxide interlevel insulator due to its low dielectric constant. In addition, the gallium oxide will not etch in a F+ containing plasma so that the oxide will make an excellent reactive ion etching mask.

The present invention provides a method for passivating the surface of a compound semiconductor in which the surface is pretreated with an annealing step and a wet etch step which leaves a monolayer of arsenic on the surface. The substrate with the monolayer of arsenic is then subjected to an $H_2$ plasma cleaning and a $N_2$ plasma cleaning resulting in the substrate having an arsenic nitride layer that is very thin. A layer of insulating material such as gallium oxide is then deposited. The passivation results in the density of interface states being extremely low which allows the Fermi level to be swept through entire band gap.

While the invention has been particularly shown and described with respect to preferred embodiments thereof, it will be understood by those skilled in the art that the forgoing and other changes in form and details may be made therein without departing from the spirit and scope of the invention which should be limited only by the scope of the appended claims.

Having thus described our invention, what we claim as new, and desire to secure by Letter Patent is:

1. A method for passivating the surface of a compound semiconductor comprising the step of:
   forming an anionic nitride layer free of a detectable amount of a cationic nitride on the surface of a compound semiconductor substrate.

2. The method according to claim 1 wherein the step of forming an anionic nitride includes the steps of:
   annealing said substrate to form an anion rich surface layer containing cationic and anionic oxides;
   stripping said cationic and anionic oxides from said surface leaving an anionic layer on said surface;
   cleaning said surface in a hydrogen plasma; and
   nitriding said anionic layer in a nitrogen plasma to form an anionic nitride layer on the surface of said substrate.

3. The method according to claim 2 wherein the substrate is annealed at a temperature range of 300°14 500° C.

4. The method according to claim 3 wherein the substrate is annealed at 470° C.

5. The method according to claim 4 wherein the substrate is annealed in an inert atmosphere.

6. The method according to claim 5 further including the step of forming a metallic contact to an opposing surface of said substrate during the annealing step.

7. The method according to claim 2 wherein the stripping step comprises subjecting the surface to a wet etch.

8. The method according to claim 7 wherein the wet etch includes cleaning the surface in a solution containing HCL.

9. The method according to claim 2 wherein the hydrogen plasma cleaning step includes an $H_2$ RF plasma at low pressure and low voltage.

10. The method according to claim 9 wherein the $H_2$ RF plasma is at a pressure in the range of 1-10 mTorr, at a voltage in the range of $-50$ to $-250$ volts dc and at a temperature in the range of 150°-300° C.

11. The method according to claim 10 wherein the $H_2$ RF plasma is at a pressure 5 mTorr, a voltage of $-150$ volts dc and a temperature of 200° C.

12. The method according to claim 2 wherein the nitrogen plasma step includes an $N_2$ RF plasma at low pressure and low temperature.

13. The method according to claim 12 wherein the $N_2$ RF plasma is at a pressure in the range 1-10 mTorr, at a voltage in the range of $-50$ to $-200$ volts dc and at a temperature in the range of 150°-300° C.

14. The method according to claim 13 wherein the $N_2$ RF plasma is at a pressure of 5 mTorr, a voltage of $-150$ volts, and a temperature of 200° C.

15. The method according to claim 2 wherein the cleaning and nitriding steps are performed in situ.

16. The method according to claim 2 further including the step of depositing an insulator on said anionic nitride layer.

17. The method according to claim 16 wherein said insulator is deposited by electron beam evaporation.

18. The method according to claim 17 wherein said electron beam evaporation is a low voltage, low pressure $O_2$ plasma.

19. The method according to claim 18 wherein the plasma is at a pressure in the range of 1 to 10 mTorr, the voltage is in the range of $-50$ to $-250$ volts dc and the temperature is in the range of 24° to 260° C.

20. The method according to claim 19 wherein the plasma pressure is 2 mTorr, the voltage is $-100$ volts dc, and the temperature is 200° C.

21. The method according to claim 16 wherein the cleaning, nitriding at insulator depositing steps are performed in situ.

22. The method according to claim 1 wherein the compound semiconductor is GaAs and the anionic nitride layer is AsN.

23. The method according to claim 22 further including the step of depositing an insulator on said anionic nitride layer.

24. The method according to claim 23 wherein the insulator is one of $Ga_2O_3$, $SiO_2$, $Al_2O_3$, AlN, and $Si_3N_4$.

25. A method for passivating the surface of a substrate of a compound semiconductor comprising the steps of:

annealing said substrate in an inert atmosphere at a temperature sufficient to form a cationic oxide of said compound semiconductor having anions and anionic oxides of said compound semiconductor included therein, removing said oxides leaving said anions on said substrate surface in the form of a thin layer, removing any chemisorbed oxygen from said thin layer, and converting said layer of anions to a layer of anionic nitride in a plasma of nitrogen, said anionic nitride being free of detectable amounts of the cationic nitride of said compound semiconductor.

26. The method according to claim 25 wherein said oxides are removed by subjecting the substrate to a dilute HCl wet etch.

27. The method according to claim 26 wherein the chemisorbed oxygen is removed by an RF plasma cleaning in $H_2$.

28. The method of claims 27 wherein the converting step is performed by an RF plasma cleaning in $N_2$.

29. The method of claim 28 further including the step of depositing an insulator on said anionic nitride layer.

30. A passivated compound semiconductor structure comprising:
a substrate of a compound semiconductor material having first and second major surfaces; and
a layer of anionic nitride of said semiconductor disposed on said first major surface, said layer being free of detectable amounts of cationic nitride of said compound semiconductor.

31. The structure according to claim 30 further including insulating material disposed on said layer of anionic nitride.

32. The structure according to claim 31 further including a metallic contact disposed on the second major surface of said substrate.

33. The structure according to claim 30 wherein said substrate is GaAs and said anionic nitride layer is AsN.

34. The structure according to claim 33 wherein said insulating material is one of $Ga_2O_3$, $SiO_2$, $Al_2O_3$, AlN and $Si_3N_4$.

* * * * *

UNITED STATES PATENT AND TRADEMARK OFFICE
CERTIFICATE OF CORRECTION

PATENT NO. : 4,859,253

DATED : August 22, 1989

INVENTOR(S) : Douglas A. Buchanan, et al.

It is certified that error appears in the above-identified patent and that said Letters Patent is hereby corrected as shown below:

Column 5, line 56, Claim 1, after "layer" insert --of said compound semiconductor--

Column 5, line 57, claim 1, after "nitride" insert --of said compound semiconductor--

Column 5, line 57, Claim 1, "a" should read as --said--

Column 8, line 7, Claim 30, "said semiconductor" should read as --said compound semiconductor--.

Signed and Sealed this

Fifteenth Day of January, 1991

Attest:

HARRY F. MANBECK, JR.

*Attesting Officer*  *Commissioner of Patents and Trademarks*